United States Patent
Murphy et al.

(10) Patent No.: US 6,795,265 B2
(45) Date of Patent: Sep. 21, 2004

(54) CLOSED LOOP CHARGE MODE DRIVE FOR PIEZO ACTUATORS USING A DC RESTORE AMPLIFIER

(75) Inventors: Terence J. Murphy, Plano, TX (US); Keith W. Malang, Longmount, CO (US); Larry G. Hutsell, Loveland, CO (US); Doug Martin, Freemont, CA (US)

(73) Assignee: Texas Instruments Incorporated, Dallas, TX (US)

( * ) Notice: Subject to any disclaimer, the term of this patent is extended or adjusted under 35 U.S.C. 154(b) by 407 days.

(21) Appl. No.: 09/877,675

(22) Filed: Jun. 8, 2001

(65) Prior Publication Data

US 2002/0085303 A1 Jul. 4, 2002

Related U.S. Application Data

(60) Provisional application No. 60/258,853, filed on Dec. 28, 2000.

(51) Int. Cl.[7] ............................................. G11B 5/596
(52) U.S. Cl. .................................................. 360/77.02
(58) Field of Search ............................... 360/75, 78.12, 360/78.05, 50, 77.02; 310/317, 318

(56) References Cited

U.S. PATENT DOCUMENTS

| | | | | |
|---|---|---|---|---|
| 5,097,171 A | * | 3/1992 | Matsunaga et al. | 310/316.01 |
| 5,479,062 A | * | 12/1995 | Yoshino | 310/316.03 |
| 5,606,416 A | * | 2/1997 | Son et al. | 356/473 |
| 5,998,994 A | * | 12/1999 | Mori | 324/212 |
| 6,006,614 A | * | 12/1999 | Guzik et al. | 73/865.6 |
| 6,075,759 A | * | 6/2000 | Yanagawa et al. | 369/44.18 |
| 6,242,910 B1 | * | 6/2001 | Guzik et al. | 324/212 |
| 6,476,537 B1 | * | 11/2002 | Pease et al. | 310/317 |
| 6,493,177 B1 | * | 12/2002 | Ell et al. | 360/78.05 |
| 6,538,839 B1 | * | 3/2003 | Ryan | 360/77.02 |
| 6,541,931 B2 | * | 4/2003 | Ho et al. | 318/560 |
| 6,600,619 B1 | * | 7/2003 | Morris et al. | 360/75 |
| 6,611,391 B1 | * | 8/2003 | Murphy et al. | 360/50 |
| 6,621,653 B1 | * | 9/2003 | Schirle | 360/78.12 |
| 6,628,472 B1 | * | 9/2003 | Ho | 360/77.04 |

* cited by examiner

Primary Examiner—David Hudspeth
Assistant Examiner—Fred F. Tzeng
(74) Attorney, Agent, or Firm—W. Daniel Swayze, Jr.; W. James Brady; Frederick J. Telecky, Jr.

(57) ABSTRACT

A piezo actuator drive circuit (40) adapted to operate in both a charge mode and a voltage mode. A low frequency compensation loop (44) is formed from a piezo actuator output (OUT6XP) of a driver (42) to the input thereof. The resulting closed loop system produces charge mode operation within a bandpass that can be tuned for desired operation. Below the bandpass turn on frequency ($F_h$) the closed loop system restores the piezo output (OUT6XP) to a defined DC voltage and compensates for any wandering effects, such as DC current mismatches in the closed loop configuration, such that the piezo output is centered around the desired DC operating point. The circuit is further provided with a DC restore feature in combination with the feedback which allows for a low frequency DC coupled path and thus allows for the DC positioning of the piezo in the charge mode to be changed. The DC restoring amplifier is used to compensate for offsets in the amplifier chain. The DC restore amplifier ensures the overall circuit is balanced and that the charge mode operation is maintained. The circuit is particularly adapted to drive a varying number of multiple piezo actuators.

18 Claims, 6 Drawing Sheets

CLOSED LOOP CHARGE MODE DRIVE FOR PIEZO ACTUATORS USING A DC RESTORE AMPLIFIER

CLAIM OF PRIORITY

This application claims priority from U.S. provisional application Serial No. 60/258,853 entitled "Closed Loop Charge Mode Drive for Piezo Actuators Using DC Restore Amplifiers" filed Dec. 28, 2000.

CROSS REFERENCE TO RELATED APPLICATIONS

Cross reference is made to commonly assigned U.S. patent application Ser. No. 09/681,695 entitled "Integrated Charge and Voltage Mode Drive Circuit for Piezo Actuators Used in Mass Data Storage Devices, or the Like", filed May 22, 2001, the teachings of which are incorporated herein by reference:

FIELD OF THE INVENTION

The present invention is generally related to the field of mass media information storage devices, and more particularly to a drive circuit and method for using a piezo actuator in both a charge mode and a voltage mode.

BACKGROUND OF THE INVENTION

Hard disk drives are mass storage devices that include a magnetic storage media, e.g. rotating disks or platters, a spindle motor, read/write heads, an actuator, a pre-amplifier, a read channel, a write channel, a servo circuit, and control circuitry to control the operation of hard disk drive and to properly interface the hard disk drive to a host system or bus. FIG. 1 shows an example of a prior art disk drive mass storage system 10. Disk drive system 10 interfaces with and exchanges data with a host 32 during read and write operations. Disk drive system 10 includes a number of rotating platters 12 mounted on a base 14. The platters 12 are used to store data that is represented as magnetic transitions on the magnetic platters, with each platter 12 coupleable to a head 16 which transfers data to and from a preamplifier 26. The preamp 26 is coupled to a synchronously sampled data (SSD) channel 28 comprising a read channel and a write channel, and a control circuit 30. SSD channel 28 and control circuit 30 are used to process data being read from and written to platters 12, and to control the various operations of disk drive mass storage system 10. Host 32 exchanges digital data with control circuit 30.

Data is stored and retrieved from each side of the magnetic platters 12 by heads 16 which comprise a read head 18 and a write head 20 at the tip thereof. The conventional readhead 18 and writehead 20 comprise magneto-resistive heads adapted to read or write data from/to platters 12 when current is passed through them. Heads 16 are coupled to preamplifier 26 that serves as an interface between read/write heads 18/20 of disk/head assembly 10 and SSD channel 28. The preamp 26 provides amplification to the waveform data signals as needed. A preamp 26 may comprise a single chip containing a reader amplifier 27, a writer amplifier, fault detection circuitry, and a serial port, for example. Alternatively, the preamp 26 may comprise separate components rather than residing on a single chip.

Piezo actuators have improved performance when driven by quantities of charge versus the amount of voltage applied to it. The charge mode drive improves two important areas of performance, both well documented in the literature, namely, effects over temperature, and effects due to hysteresis. To operate a piezo actuator in a charge mode configuration, the drive circuit output must be placed in a high impedance, open loop state. Disadvantageously, once in an high impedance state, the piezo actuator can drift through charge loss, wander due to transducer effects, or simply wander due to a variety of effects and lack of feedback.

There is desired an improved piezo actuator drive circuit that can be advantageously operated in a charge mode configuration without the conventional drawbacks discussed above. Moreover, there is desired a piezo actuator drive allowing for a varying number of piezo elements, such as up to 8 elements.

SUMMARY OF THE INVENTION

The present invention achieves technical advantages as a piezo actuator driver having a low frequency compensation loop formed from the piezo actuator output to the driver input. The driver circuit is adapted to drive multiple piezo actuators, which number may vary from drive to drive. This circuit advantageously results in a closed loop system having a charge mode operation within a bandpass that can be tuned for desired operation. Below the bandpass turn on the circuit operates in the voltage mode, and the closed loop system restores the piezo output to a defined DC voltage and compensates for any wandering effects. The closed loop system also compensates for any DC current mismatches in the closed loop configuration such that the piezo output is centered around a desired DC operating point.

The present invention advantageously uses a second amplifier with a resistor/capacitor configured as an integrator to set up the DC restore for the piezo driver and produce a highpass response. At high frequencies above the cut on of the loop, the driver is advantageously in a charge mode drive. However, below the cut on frequency, the driver is in a voltage mode and restoring the output to a commanded DC voltage. This circuit is compatible with a voltage mode drive, yet provides a charged mode solution without the conventional drawbacks including wandering output DC voltage. Offsets are compensated by the loop.

DETAILED DESCRIPTION OF THE PREFERRED EMBODIMENT AND BEST MODE

Figure 1:
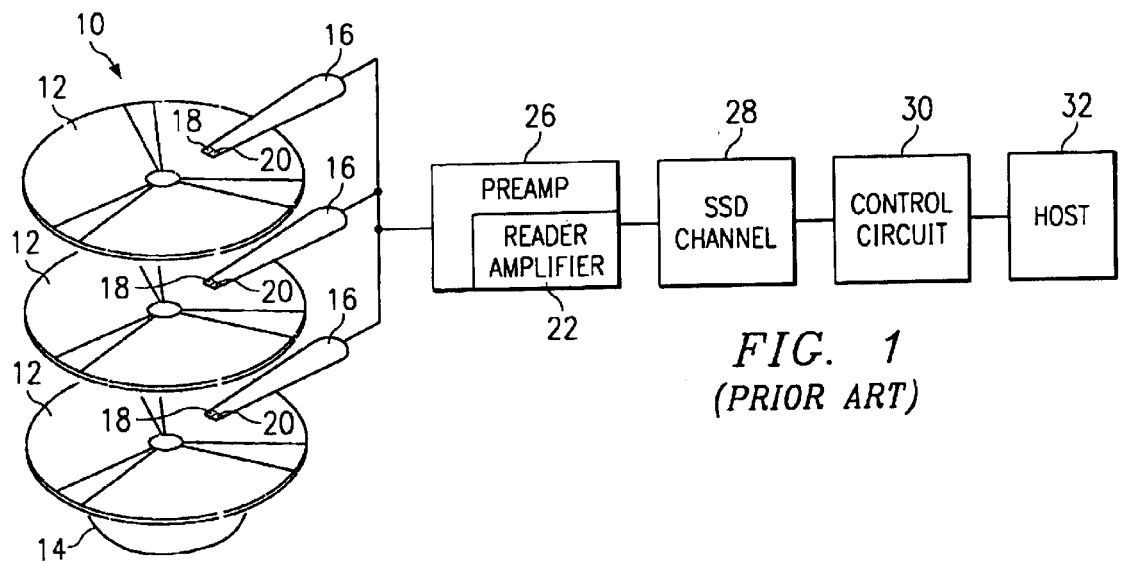
FIG. 1 illustrates a conventional disk drive system including multiple rotating disks or platters, read/write heads, a piezo actuator, a servo circuit, and associated amplifier and control circuitry.
Figure 9:
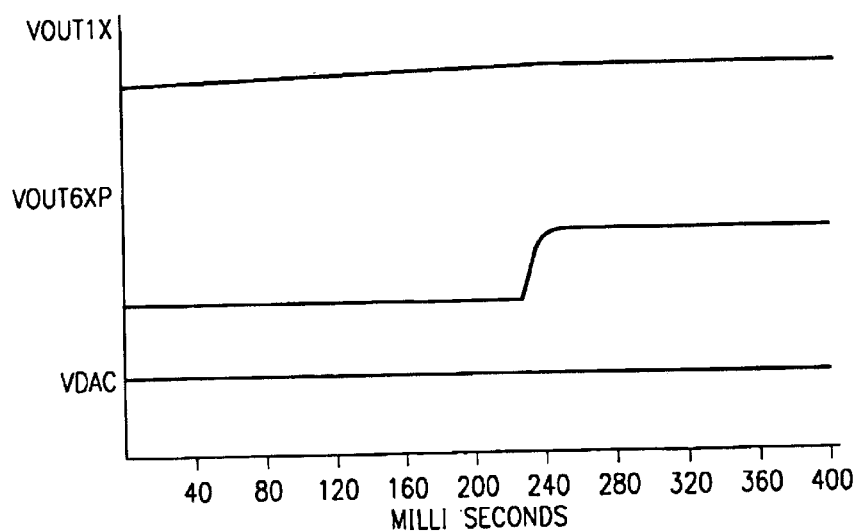
FIG. 9 is a graphical illustration of the outputs OUT1X and OUT6XP as a function of time for a power up sequence with the DC restore loop being initialized.
Figure 2:
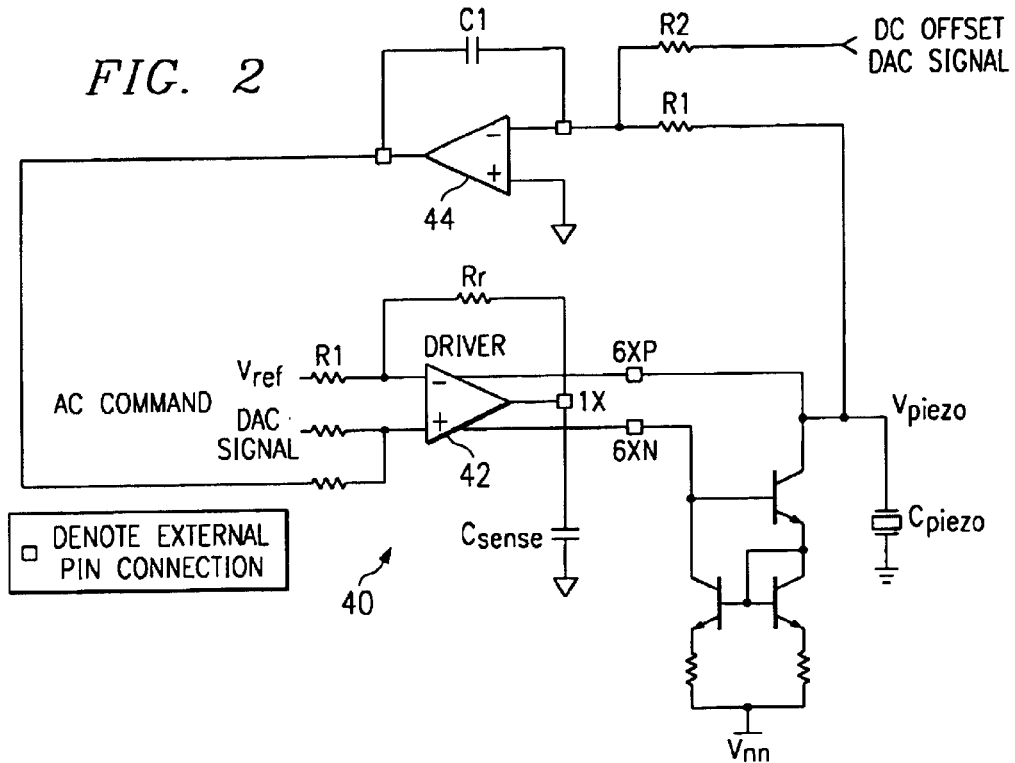
FIG. 2 depicts a simplified schematic of the piezo drive circuit of the present invention including the DC restore feedback loop.

Referring now to FIG. 2, there is depicted at 40 a simplified schematic of the present invention seen to comprise a piezo actuator circuit adapted to drive a piezo actuator in both a charge mode and a voltage mode. Circuit 40 is seen to include a differential drive amplifier 42 having an inverting input connected to a voltage reference $V_{ref}$, and a non-inverting input coupled to and controlled by a AC command signal provided by a digital to analog converter (DAC) as will be discussed shortly. Driver 42 is seen to have a 1X output that is placed at a capacitor shown as $C_{piezo}$. Driver 42 also has two outputs identified as OUT6XP and OUT6XN coupled to current mirrors based on the currents of the OUT1X output. Each of these two outputs provides current equal to 6.125× the current sent out on the OUT1X output. This will be discussed in more detail shortly.

Circuit 40 is seen to further comprise of a low frequency voltage nulling loop around the charge control driver circuit 42 including an operational amplifier 44. The inverting input of amplifier 44 is coupled to the OUT6XP output, and having its output connected to the non-inverting input of driver 42, as shown. A feedback capacitor C1 is provided such that amplifier 44 is configured as a high frequency integrator. The feedback path from the OUT6XP output to the input of the driver 42 provided through the integrating DC restore amplifier 44 advantageously has the effect to null any DC offsets at the capacitor $C_{piezo}$. By providing this feedback, the system is overall balanced and the charge mode operation is maintained. The effect of the DC restore feedback removes any DC response from the DAC signal to the piezo output, however, this does not hinder system operation.

As mentioned above, the DC restore feature creates an AC coupled solution from the DAC input to the output OUT6XP, which is also referred to as the piezo drive node. It is also desired to have some control, from a DC coupled standpoint, as to where the OUT6XP output tends to at DC. Advantageously, this is accomplished with another input feature added through the offset DAC into a resistor, shown as the DC offset DAC signal coupled through resistor R2 and summed at the inverting input of amplifier 44. This resistor R2 is connected to the DC restore amplifier and allows for a low frequency DC coupled path and thus allows the DC positioning of the piezo in the charge mode to be changed.

Figure 3:
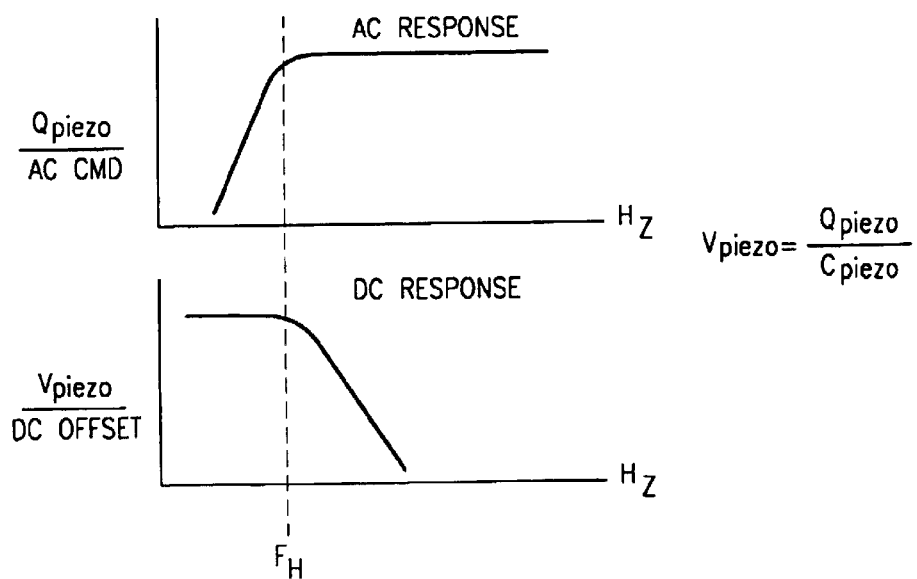
FIG. 3 is a graph of the AC response and DC response of the piezo actuator drive, the AC response being a function of the AC command signal and the DC response being a function of the DC offset.

Referring now to FIG. 3, there is depicted both the AC response and DC response of circuit 40. Notably, the AC response is flat above the bandpass frequency $F_h$, yet tapers to 0 below the bandpass frequency. Conversely, the DC response is flat below the bandpass frequency, but tapers off above the bandpass frequency at $F_h$. The AC response curve depicts on the vertical axis the value $Q_{piezo}$/AC command as a function of frequency. With respect to the DC response, the vertical axis depicts the relationship of $V_{piez}$/DC offset as a function of frequency. The following relationship applies;

$$V_{piezo}=Q_{piezo}\div C_{piezo}$$

Figure 4:
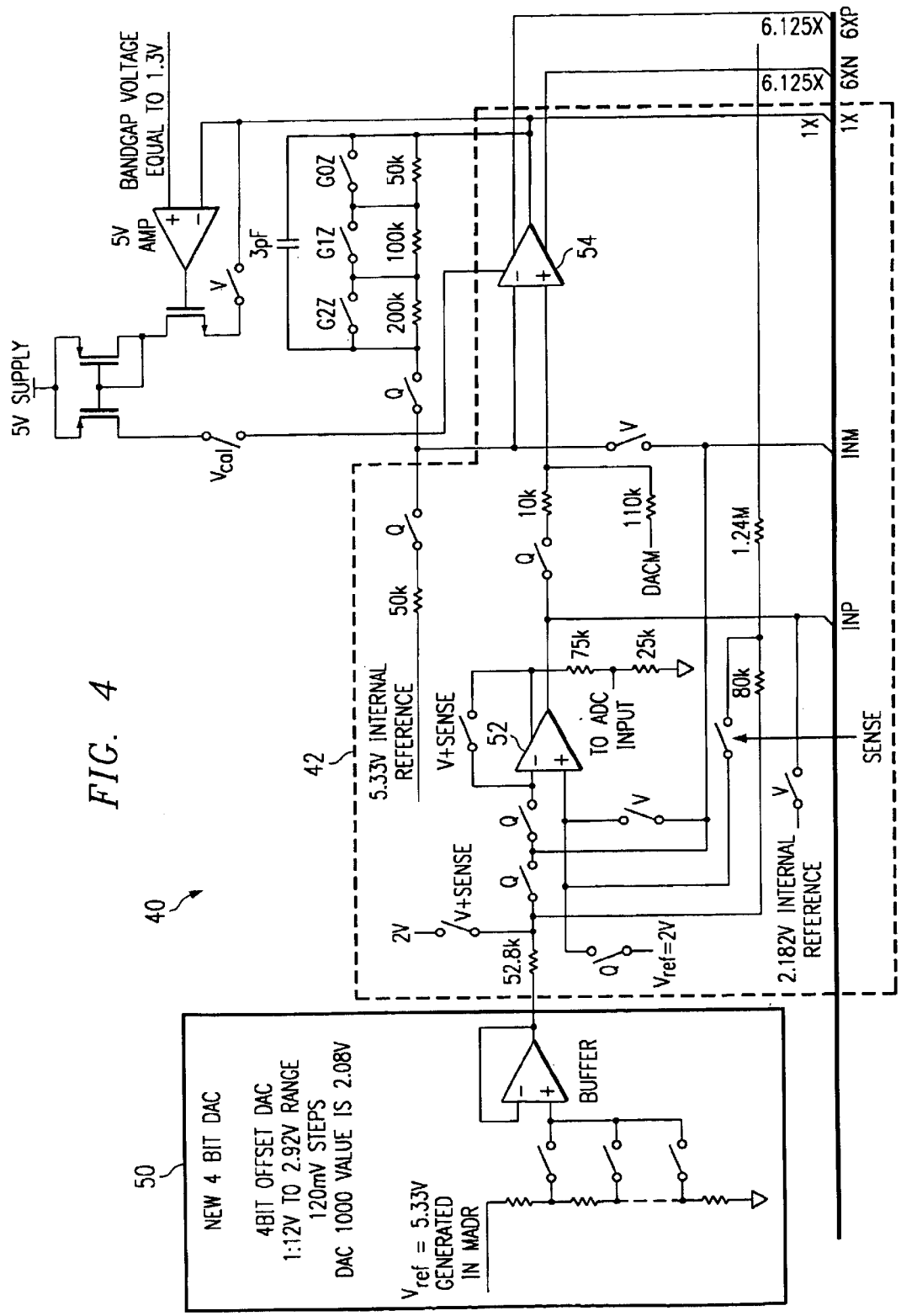
FIG. 4 is a detailed schematic of the present invention.

Turning now to FIG. 4, there is depicted a more detailed schematic of circuit 40, whereby the driver 42 is shown as amplifier 54 with feedback selectable by switches. The DC restore amplifier is depicted as amplifier 52 with its feedback and switches that select between charge and voltage mode. A four-bit digital-to-analog converter (DAC) 50 is seen to provide the DC command input to the inverting input as shown.

Figure 5:
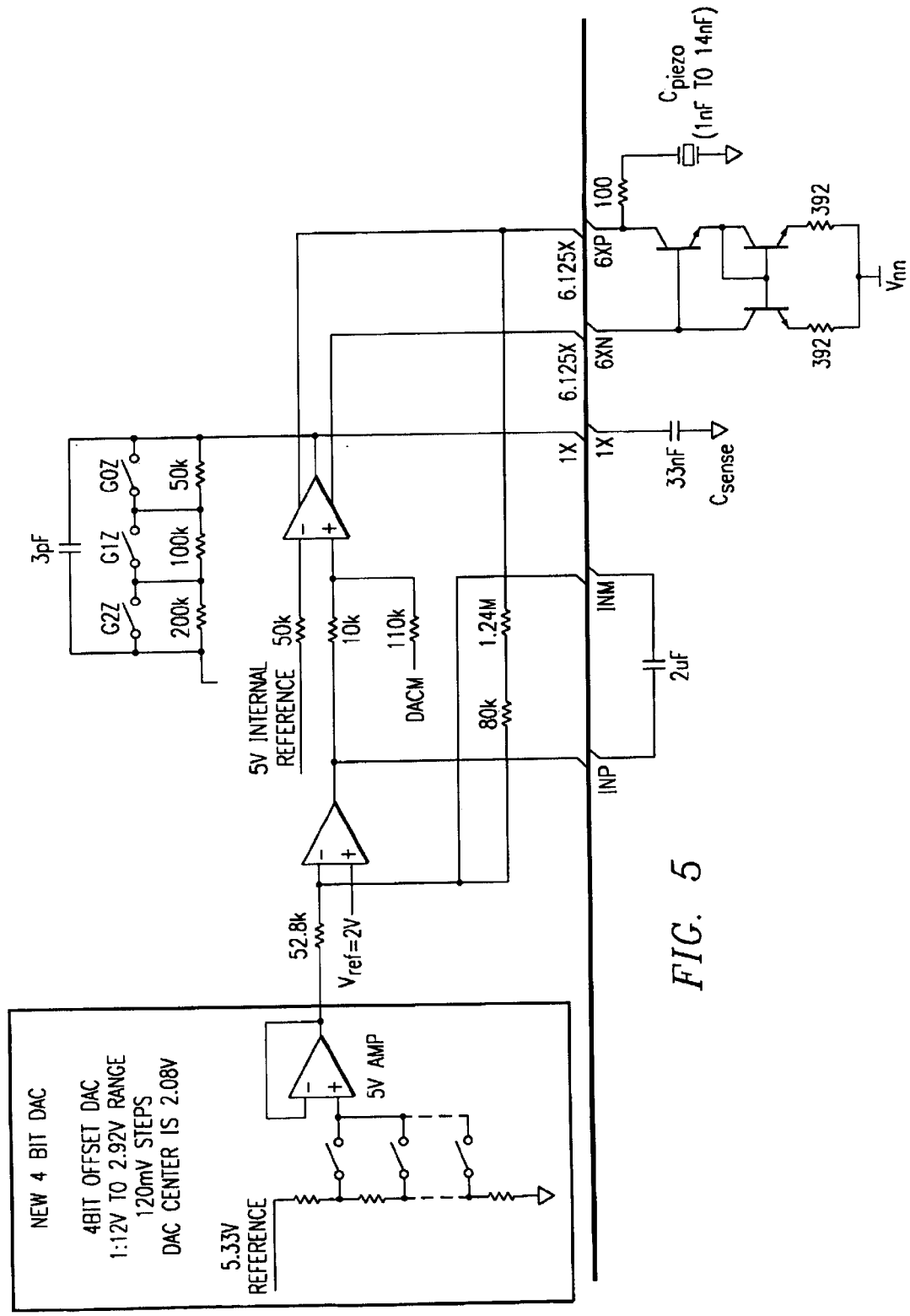
FIG. 5 illustrates that portion of the schematic of FIG. 4 operative during the charge mode operation thereof.
Figure 6:
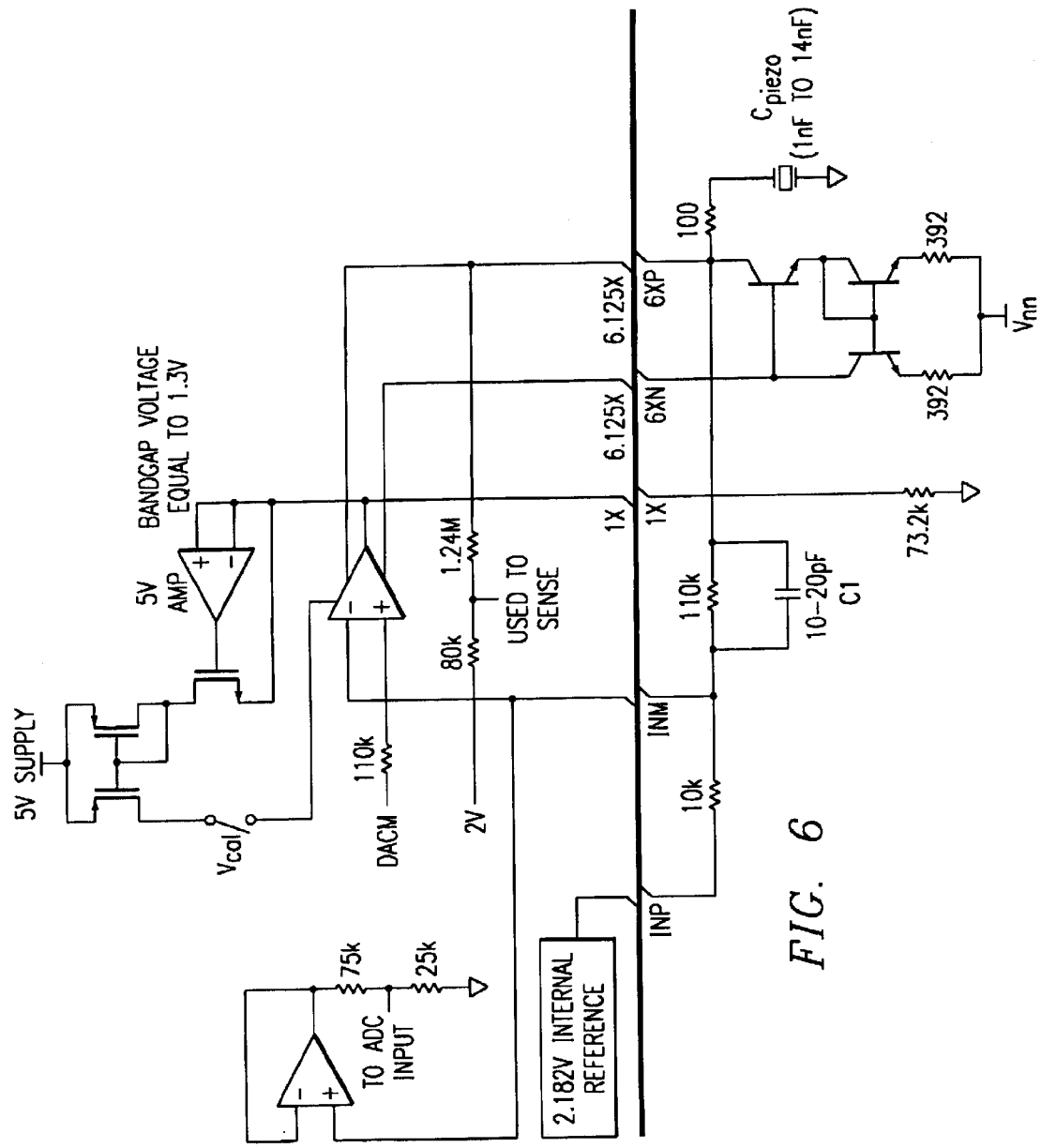
FIG. 6 illustrates that portion of the schematic of FIG. 4 active during the voltage mode operation thereof.
Figure 7:
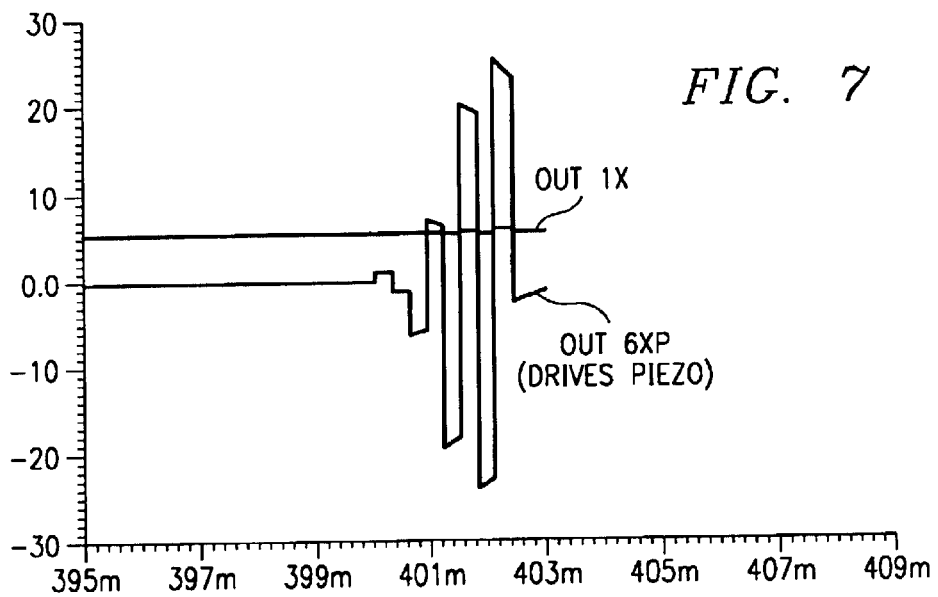
FIG. 7 is a waveform diagram illustrating the transient response of the piezo actuator at both the output OUT1X and output OUT6XP.
Figure 8:
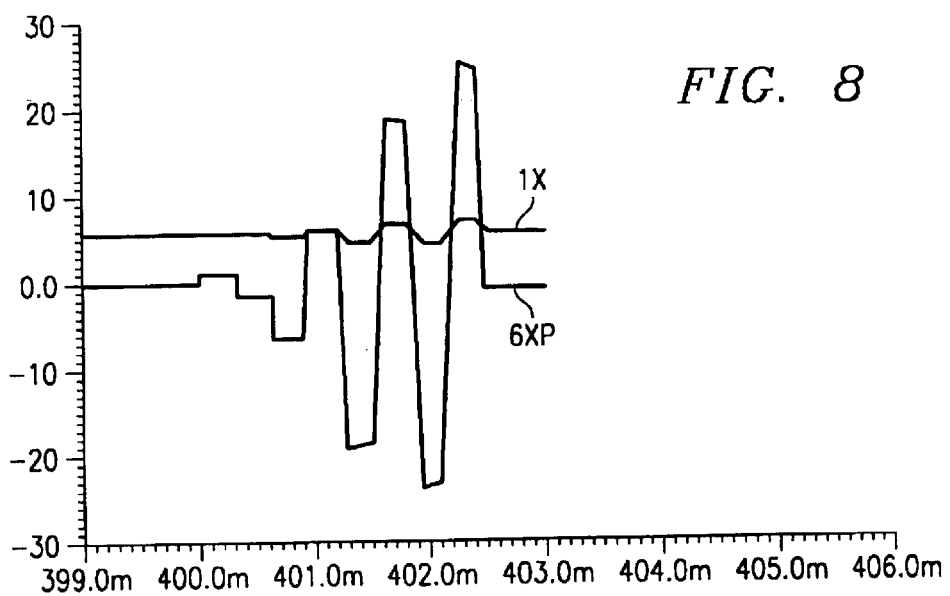
FIG. 8 is a waveform depicting the transient response of the piezo actuator when driving 8 elements.

FIG. 5 depicts the active circuitry when the circuit is operating in the charge mode, and FIG. 6 illustrates the active circuitry of circuit 40 when the circuit operates in the voltage mode. Thus, reference to FIGS. 4, 5 and 6 is made during the following discussion as to the operation of the present invention.

Circuit 40 provides the ability to program between voltage mode and charge mode operation by changing a MCTRL<3> bit in the serial port which controls a milliactuator signal QVZ. When in the voltage mode, the circuit operates with feedback capacitor C1 provided externally. The offset DAC is not active. The reference amplifier block provides a 2.182 volt bias voltage to the INP pin that is connected to the externally configured feedback. The voltage mode operation does have a calibration mode that is selected using a MCTRL<4> bit in the serial port which enables a milliactuator signal CAL. CAL mode provides a fixed positive current on the output OUT6XP which will charge the piezo capacitor $C_{piezo}$. The output voltage of the piezo is then sensed using the external resistor feedback network and the REFAMP2 amplifier of the drive block (_DRV). The REFAMP2 blocks output is sent to the ADC of the circuit and the customer has access to the desired piezo output voltage.

In the charge mode, the advantageous features of the milliactuator solution circuit 40 are featured. The features include the charge mode operation being provided for varying number of piezo elements, how the operation is maintained when normal offsets from processing are present, and how a DC coupled input is provided in conjunction with the DC restore operation.

The first advantageous feature is how the charge mode solution allows for a varying number of piezo elements. This is accomplished by setting up a voltage mode feedback on the OUT1X output using the amplifier 42. The feedback is internal to the integrated circuit (IC), but could be provided externally as well. The DAC input is at the input of the amplifier 42 and is gained up through the amplifier feedback and provided to the OUT1X output. A capacitor $C_{sense}$ is place on the OUT1X output. Based on the voltage swing of the capacitor and the capacitor value, a certain amount of charge is placed in the capacitor $C_{sense}$. The OUT6PX and OUT6XN outputs are current mirrors based on the currents of the OUT1X output. These outputs each provide current equal to 6.125× the current sent out on the OUT1X signal. Given a certain amount of charge provided to the OUT1X output, 6.125 times this charge is provided to the OUT6XP or OUT6XN outputs depending on whether the charging on OUT1X is positive or negative-, that is, negative charging shows up on OUT6XN and vice versa for OUT6XP. If the load on OUT6XP, which is the main point of interest since the piezo element will be connected there, changes due to a different number of piezo elements used (this is common place for piezo actuator applications where a different number of actuators are being driven depending on the system configuration), then the output charge gain needs to be changed according to the number of piezo elements on the output.

Advantageously, this is accomplished by correspondingly switching the gain of the feedback on OUT1X and thus change the overall charge gain. One important aspect to this is that there are two important time constants that must be matched to keep the overall transfer function matched. The resistor value in the feedback on OUT1X multiplied by the capacitor used on OUT1X must match the output piezo capacitance (total load of all piezo elements used) and the resistance seen on the OUT6XP output. Therefore, the solution for changing the gain on the OUT1X is done with the overall feedback resistance changing using switches G0Z, G1Z and G2Z such that the RC product on the OUT1X is matched to the changing RC on OUT6XP, which changes with the number of piezo elements, —and this is a key feature also provided by the solution.

The advantageous second feature is how the DC restore amplifier 44 is used to compensate for offsets in the OUT1X/

OUT6XP circuit chain. There will be some current mismatch when the amplifier chain is manufactured, and this mismatch could cause the OUT6XP output to saturate into one rail or the other. This would make the solution non-usable and make the charge mode solution useless. To overcome this, a feedback path from the OUT6XP output to the input of the amplifier 42 is provided through the integrating DC restore amplifier 44. The effect of the feedback is to null any DC offsets. By providing this feedback, the system is overall balanced and the charge mode operation is maintained. The effect of the DC restore feedback does remove any DC response from the DAC signal to the piezo output, however, this does not hinder system operation.

The advantageous third feature is the DC coupled input. As mentioned above, the DC restore feature creates an AC coupled solution from DAC input to the OUT6XP output (piezo drive node). It is desired to also have some control, from a DC coupled standpoint, as to where the OUT6XP output tends to at DC. This is accomplished with another input feature added through the offset DAC into a resistor. This resistor R2 is connected to the DC restore amplifier and allows for a low frequency DC coupled path and thus allows the DC positioning of the piezo in charge mode to be changed.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A piezo actuator drive circuit, comprising:
   a drive amplifier having an input, and an output adapted to drive a piezo actuator; and
   a low frequency compensation loop coupled between the drive amplifier output and the drive amplifier input, the compensation loop establishing a charge mode operation of the piezo actuator,
   wherein the compensation loop establishes a bandpass frequency; and
   wherein the drive circuit drives the piezo actuator in a voltage mode with a drive signal provided to the amplifier input being below the bandpass frequency, and drives the piezo actuator in the charge mode when the drive signal is above the bandpass frequency.

2. The drive circuit as specified in claim 1 wherein the drive amplifier is adapted to drive a varying number of piezo actuators in the charge mode.

3. The drive circuit as specified in claim 2 wherein the drive amplifier has a voltage mode feedback configured to allow multiple piezo actuators to be driven in the charge mode.

4. The drive circuit as specified in claim 1 wherein the drive circuit is adapted to drive at least 8 piezo actuators in the charge mode.

5. A piezo actuator drive circuit, comprising:
   a drive amplifier having an input, and an output adapted to drive a piezo actuator; and
   a low frequency compensation loon coupled between the drive amplifier output and the drive amplifier input, the compensation loop establishing a charge mode operation of the piezo actuator,
   wherein the compensation loop comprises an integrator.

6. The drive circuit as specified in claim 5 further comprising a DC restore circuit adapter to adjust DC offset to the piezo actuator.

7. The drive circuit as specified in claim 6 wherein the DC restore circuit forms a portion of the compensation loop.

8. The drive circuit as specified in claim 7 wherein the compensation loop comprises an integrator with the DC restore circuit being coupled to the integrator.

9. A piezo actuator drive circuit, comprising:
   a drive amplifier having an input, and an output adapted to drive a piezo actuator; and
   a low frequency compensation loon coupled between the drive amplifier output and the drive amplifier input, the compensation loon establishing a charge mode operation of the piezo actuator,
   wherein the drive amplifier has a voltage mode feedback configured to allow multiple piezo actuators to be driven in the charge mode; and
   wherein the voltage mode feedback includes a capacitor coupled at the drive amplifier output, wherein the voltage mode feedback senses the voltage at the capacitor.

10. The drive circuit as specified in claim 9 wherein the voltage mode feedback has an adjustable gain being variable as a function of the number of piezo actuators driven.

11. The drive circuit as specified in claim 10 wherein the adjustable gain is accomplished using a variable resistor in the voltage mode feedback.

12. A piezo actuator drive circuit, comprising:
    a drive amplifier having an input, and an output adapted to drive a piezo actuator; and
    a low frequency compensation loop coupled between the drive amplifier output and the drive amplifier input, the compensation loop establishing a charge mode operation of the piezo actuator,
    wherein the drive amplifier has a first output, and a second output having a current mirror based on the first output.

13. The drive circuit as specified in claim 12 wherein a capacitor is coupled to the first output and the piezo actuators are adapted to be driven by the second output.

14. The drive circuit as specified in claim 13 wherein a first time constant formed by the capacitor and the voltage mode feedback, and a second time constant formed by the piezo actuators and the voltage mode feedback, are substantially equal.

15. A piezo actuator drive circuit, comprising:
    a drive amplifier having an input, and an output adapted to drive a piezo actuator; and
    a low frequency compensation loop coupled between the drive amplifier output and the drive amplifier input, the compensation loon establishing a charge mode operation of the piezo actuator,
    further comprising a DC control circuit controlling the DC value at the piezo actuator.

16. The drive circuit as specified in claim 15 wherein the DC control circuit is integrated into the low frequency compensation loop.

17. A piezo actuator drive circuit, comprising:
    a drive amplifier having an input, and an output adapted to drive a piezo actuator; and
    control circuitry controlling the drive amplifier such that it is controllable between a voltage mode and a charge mode,
    wherein the drive amplifier has a voltage mode feedback configured to allow multiple piezo actuators to be driven in the voltage mode.

18. The drive circuit as specified in claim 17 wherein the drive amplifier is adapted to drive a varying number of piezo actuators in the voltage mode.

* * * * *